US012131890B2

(12) United States Patent
Erickson et al.

(10) Patent No.: US 12,131,890 B2
(45) Date of Patent: Oct. 29, 2024

(54) CHUCK FOR PLASMA PROCESSING CHAMBER

(71) Applicant: Lam Research Corporation, Fremont, CA (US)

(72) Inventors: Ann Erickson, Lake Oswego, OR (US); Darrell Ehrlich, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 290 days.

(21) Appl. No.: 17/435,340

(22) PCT Filed: Mar. 4, 2020

(86) PCT No.: PCT/US2020/021003
§ 371 (c)(1),
(2) Date: Aug. 31, 2021

(87) PCT Pub. No.: WO2020/185467
PCT Pub. Date: Sep. 17, 2020

(65) Prior Publication Data
US 2022/0139681 A1  May 5, 2022

Related U.S. Application Data

(60) Provisional application No. 62/815,876, filed on Mar. 8, 2019.

(51) Int. Cl.
*H01J 37/32* (2006.01)
*H01L 21/683* (2006.01)

(52) U.S. Cl.
CPC .. *H01J 37/32724* (2013.01); *H01J 37/32642* (2013.01); *H01L 21/6833* (2013.01); *H01J 37/32082* (2013.01); *H01J 2237/2007* (2013.01); *H01J 2237/334* (2013.01)

(58) Field of Classification Search
CPC ......... H01J 37/32724; H01J 37/32642; H01L 21/6833
See application file for complete search history.

(56) References Cited

U.S. PATENT DOCUMENTS

| 6,589,352 | B1* | 7/2003 | Yudovsky | C23C 16/4585 |
| | | | | 118/728 |
| 8,129,016 | B2 | 3/2012 | Kawajiri et al. | |
| 8,390,980 | B2 | 3/2013 | Sansoni et al. | |

(Continued)

FOREIGN PATENT DOCUMENTS

| CN | 100580900 | 1/2010 |
| CN | 102822956 | 12/2012 |

(Continued)

OTHER PUBLICATIONS

International Search Report from International Application No. PCT/US2020/021003 dated Jun. 26, 2020.

(Continued)

*Primary Examiner* — Scott Bauer
(74) *Attorney, Agent, or Firm* — Beyer Law Group LLP

(57) ABSTRACT

An electrostatic chuck system for a plasma processing chamber is provided. A base plate comprising Al—SiC is provided. A ceramic plate is disposed over the base plate. A bonding layer bonds the ceramic plate to the base plate.

13 Claims, 2 Drawing Sheets

(56) References Cited

U.S. PATENT DOCUMENTS

| | | | |
|---|---|---|---|
| 9,909,197 | B2 | 3/2018 | Lee et al. |
| 11,837,479 | B2 | 12/2023 | Silveira et al. |
| 2005/0101082 | A1 | 5/2005 | Yokoyama et al. |
| 2008/0017104 | A1 | 1/2008 | Matyushkin et al. |
| 2013/0093145 | A1* | 4/2013 | Hori .................. C04B 35/63452 279/128 |
| 2015/0373783 | A1 | 12/2015 | Kitagawa |
| 2015/0377571 | A1 | 12/2015 | Hiroki |
| 2016/0358761 | A1* | 12/2016 | Atlas ................. H01J 37/32697 |
| 2016/0375515 | A1* | 12/2016 | Xu ......................... C25D 11/04 228/176 |
| 2017/0043402 | A1 | 2/2017 | Di Serio et al. |
| 2017/0098566 | A1 | 4/2017 | Long et al. |
| 2017/0189965 | A1 | 7/2017 | Vaidya et al. |
| 2017/0229326 | A1 | 8/2017 | Tran et al. |
| 2018/0012785 | A1* | 1/2018 | Matyushkin ...... H01L 21/67103 |
| 2018/0058327 | A1 | 3/2018 | Tajiri et al. |
| 2018/0277412 | A1* | 9/2018 | Kimball ............ H01J 37/32568 |
| 2019/0013184 | A1* | 1/2019 | Cui ................... H01J 37/32174 |
| 2019/0043746 | A1 | 2/2019 | Yoshioka et al. |

FOREIGN PATENT DOCUMENTS

| | | |
|---|---|---|
| CN | 102160167 | 12/2013 |
| CN | 106270863 | 1/2017 |
| CN | 108284226 | 7/2018 |
| CN | 106413946 | 1/2020 |
| JP | H10-270540 | 10/1998 |
| JP | 2011-222979 | 11/2011 |
| JP | 2016-012593 | 1/2016 |
| JP | 2016-027601 | 2/2016 |
| JP | 2017-085089 | 5/2017 |
| KR | 10-2016-0078220 | 7/2016 |
| KR | 10-2017-0002306 | 1/2017 |
| KR | 10-1768517 | 8/2017 |
| KR | 10-2018-0133536 | 12/2018 |
| TW | 200807560 | 2/2008 |
| TW | I449124 | 8/2014 |
| TW | 201726367 | 8/2017 |
| TW | 201821183 | 6/2018 |

OTHER PUBLICATIONS

Written Opinion from International Application No. PCT/US2020/021003 dated Jun. 26, 2020.
Taiwanese Office Action from Taiwanese Application No. 109107389 dated Mar. 11, 2024.
Japanese Office Action (Notice of Reasons for Refusal) from Japanese Application No. 2021-552981 dated Mar. 19, 2024.
Chinese Office Action from Chinese Application No. 202080019750.7 dated Jun. 27, 2024 with Machine Translation.
Korean Office Action from Korean Application No. 10-2021-7031597 dated Jul. 11, 2024 with Machine Translation.
Taiwanese Office Action from Taiwanese Application No. 109107389 dated Jul. 15, 2024 with Machine Translation.

* cited by examiner

CHUCK FOR PLASMA PROCESSING CHAMBER

CROSS-REFERENCE TO RELATED APPLICATION

This application claims the benefit of priority of U.S. Application No. 62/815,876, filed Mar. 8, 2019, which is incorporated herein by reference for all purposes.

BACKGROUND

This disclosure relates to components of plasma processing chambers used in semiconductor processing. More specifically, the disclosure relates to electrostatic chucks used in plasma processing chambers.

In plasma processing chambers, electrostatic chucks are used to support substrates being processed. The electrostatic chucks may be subjected to different temperatures.

SUMMARY

To achieve the foregoing and in accordance with the purpose of the present disclosure, an electrostatic chuck system for a plasma processing chamber is provided. A base plate comprising Al—SiC is provided. A ceramic plate is disposed over the base plate. A bonding layer bonds the ceramic plate to the base plate.

These and other features of the present disclosure will be described in more detail below in the detailed description of the disclosure and in conjunction with the following figures.

BRIEF DESCRIPTION OF THE DRAWINGS

The disclosed embodiments are illustrated by way of example, and not by way of limitation, in the figures of the accompanying drawings and in which like reference numerals refer to similar elements and in which.

DETAILED DESCRIPTION

Figure 1:
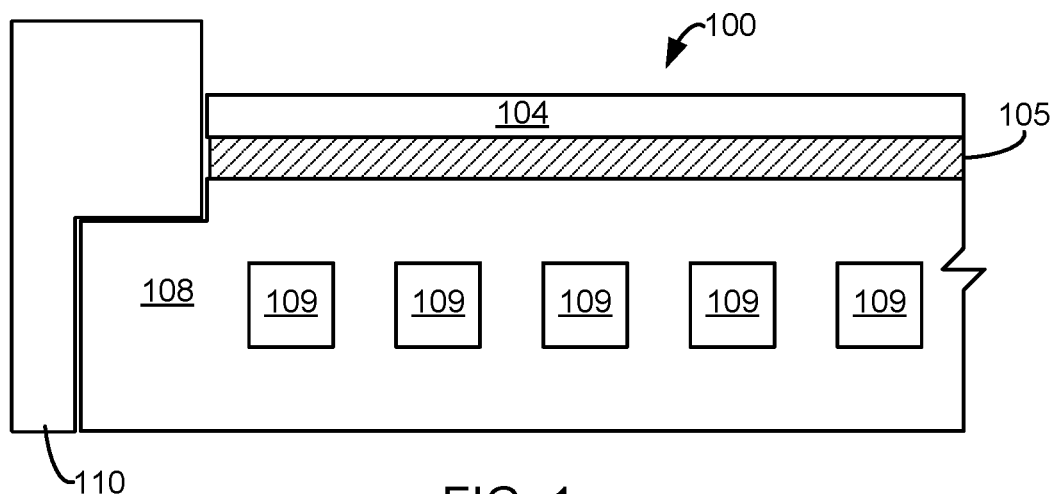
FIG. 1 is a partial cross-sectional view of an embodiment of an electrostatic chuck.

Embodiments will now be described in detail with reference to a few of the embodiments thereof as illustrated in the accompanying drawings. In the following description, specific details are set forth in order to provide a thorough understanding of the present disclosure. However, the present disclosure may be practiced without some or all of these specific details, and the disclosure encompasses modifications which may be made in accordance with the knowledge generally available within this field of technology. Well-known process steps and/or structures have not been described in detail in order to not unnecessarily obscure the present disclosure.

Electrostatic chuck (ESC) system technology may require bonding a ceramic material/layer to a heat sinking (cooling) base plate. A bonding layer is typically used to bond the ceramic layer to the base plate. The base plate is usually made from aluminum metal. Aluminum is chosen because it is cheap, easy to manufacture, and has a high thermal conductivity, leading to uniform heat sinking temperature at the bonding layer. However, aluminum has a coefficient of thermal expansion (CTE) of 23 (parts per million per degree centigrade) ppm/° C., which is significantly higher than the CTE of ceramic, which is typically closer to 7-10 ppm/T.

The mismatch between the high CTE of aluminum and that of the ceramic material used in the ESC is a significant disadvantage in a plasma etcher system. The bonding layer undergoes significant mechanical strain at very low temperatures. The base plate contracts roughly 3 times more than the ceramic layer, limiting the thermal operating window of the ESC. Additionally, the edge ring design in the plasma etch chamber needs to account for the wide range of base plate sizes over the thermal operating window. This leaves gaps between the edge ring and the base plate at some temperatures. The gaps may be filled with gas creating a parasitic plasma.

Titanium-based base plates with low CTE have been used. However, titanium and titanium based alloys have extremely low thermal conductivity, thereby raising the risk of thermal nonuniformity at the top surface of the base plate, with a potential impact on the wafer level temperature uniformity. Additionally, the low thermal conductivity of the base plate limits the minimum operating temperature under a plasma load by leaving a larger temperature drop between the coolant setpoint and the temperature at the top of the base plate.

Various embodiments pertain to an ESC, where the base plate is made from an aluminum silicon carbide (Al—SiC) alloy. An ESC made using such a base plate would have significant advantages over previous base plate technology. Alloys based on Al—SiC provide a balance of low CTE with high thermal conductivity. In various embodiments, the thermal operating range of such ESC could be expanded over that of ESCs with aluminum base plates, as bonding strain is reduced due to the more closely matched CTE of the ceramic layer and the base plate. In various embodiments, less movement would occur at connections between chamber hardware and the base plate, compared to aluminum base plate ESCs, thereby reducing requirements on shim material, electrical connection flexibility, and O-ring wear. In addition, gaps between the base plate and an edge ring could be reduced and designed to be tighter than for aluminum base plate ESCs. The reduced gaps reduce etch byproduct deposition, surface degradation, and plasma discharge in the regions between the edge ring and the base plate. In various embodiments, the ESC would have improved thermal uniformity over an ESC with a titanium-alloy base plate, due to the improved thermal conductivity. Improved thermal uniformity allows for improved processing uniformity across a wafer surface. In addition, the improved thermal conductivity of the base plate may allow lower plasma processing temperature under a heat load, due to reduced temperature drop between the base plate top surface and the coolant.

FIG. 1 is a schematic cross-sectional view illustrating one embodiment of an electrostatic chuck (ESC) 100. A ceramic plate/layer 104 may be bonded by a bonding layer 105 to a base plate 108 comprising Al—SiC. Al—SiC is a metal matrix composite, comprising an aluminum matrix with silicon carbide (SiC) particles. In one embodiment, the bonding layer 105 may be a polymer adhesive, such as, silicone with filler particles to increase the thermal conductivity of the polymer adhesive. The base plate 108 may contain channels 109 for gas or liquid flow. These channels 109 may, for example, be formed in complex distribution channels in order to cool or heat the ESC 100. In various embodiments, the channels 109 are temperature control channels. An edge ring 110 surrounds the electrostatic chuck 100. In this example, the edge ring 110 comprises quartz or silicon. In other embodiments, the edge ring 110 comprises ceramic or plasma corrosion resistant glass. The edge ring 110 may comprise aluminum oxide or aluminum nitride. In this embodiment, the ceramic plate 104 comprises aluminum oxide or aluminum nitride.

Figure 2:
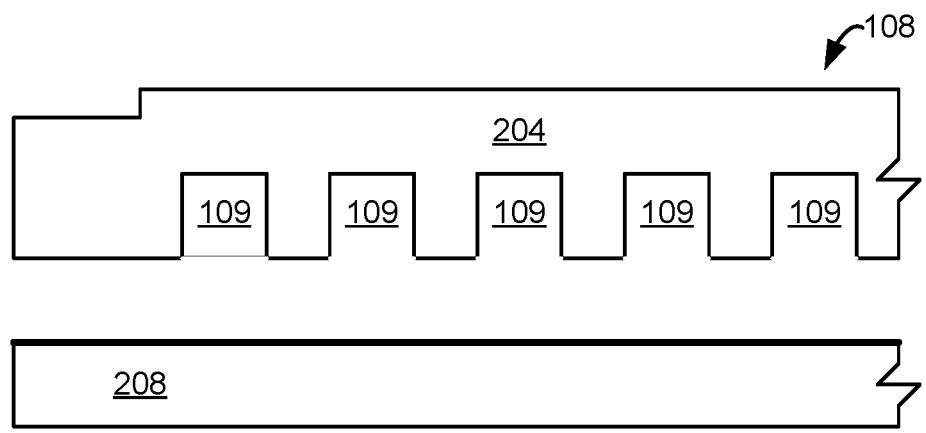
FIG. 2 is a partial cross-sectional view of another embodiment.

FIG. 2 illustrates how the base plate 108 is formed in an embodiment. The base plate 108 comprises a top plate 204 and a bottom plate 208. The top plate 204 has the channels 109 machined into the bottom of the top plate 204. The top plate 204 and the bottom plate 208 may be brazed together to form the base plate 108.

In an embodiment, the top plate 204 and bottom plate 208 are formed from Al—SiC that is about 20% SiC by weight. The channels 109 are machined into the top plate 204. It has been found that Al—SiC that has about 20% SiC by weight is easy to machine and has a CTE that is closer to the CTE of the ceramic plate 104 than the CTE of aluminum is to the CTE of the ceramic plate 104.

In this embodiment, the ceramic plate 104 has a CTE of 7-8 ppm/° C. and a thermal conductivity of 18 watts per meter Kelvin (W/mK). The Al—SiC base plate 108 has a CTE of 13-15 ppm/° C. and a thermal conductivity of greater than 170 W/mK. The edge ring 110 is made of quartz and has a CTE of 0.5 ppm/° C. and a thermal conductivity of 2 W/mK. Therefore, in this embodiment the difference between the CTE of the Al—SiC base plate 108 and the CTE of the ceramic plate 104 is between 5-8 ppm/° C. In addition, the difference between the CTE of the Al—SiC base plate 108 and the CTE of the edge ring 110 is between 12.5-14.5 ppm/° C. In contrast, a base plate with aluminum would have a CTE of 23 ppm/° C. and thermal conductivity of greater than 200 W/mK. Although the Al—SiC base plate 108 does not have a CTE that is exactly equal to the CTE of the ceramic plate 104 or CTE of the edge ring 110, the Al—SiC nonetheless has a CTE that is closer to the CTE of the ceramic plate 104 and the CTE of the edge ring 110 than the CTE of aluminum is to the CTE of the ceramic plate 104 and the CTE of the edge ring 110.

In various embodiments, the base plate 108 is formed from Al—SiC with 18% to 65% SiC by weight. In various embodiments, the base plate 108 is formed from Al—SiC with 18% to 40% SiC by weight. In various embodiments, the base plate 108 is formed from Al—SiC with 18% to 30% SiC by weight. It has been found that Al—SiC with 18% to 30% SiC by weight is easier to machine. Al—SiC with 40% to 65% by weight may be more difficult to machine, but also has a lower CTE than Al—SiC with a lower percentage SiC.

In other embodiments, the bonding layer 105 may comprise materials with less compliance than could be used with the aluminum base plate, because the bonding materials need not tolerate as much strain if the CTE match between the ceramic plate 104 and the base plate 108 is improved. For example, higher thermal conductivity silicone bonds may be used with a system that has less strain for the same temperature window. Higher thermal conductivity silicone bonds tend to be stiffer than lower thermal conductivity silicone bonds due to the increased filler content. In another embodiment, bonding materials that require a higher temperature to cure can be used for a system with a good CTE match, where the strain for a CTE mismatched system may be excessively high.

In another embodiment, an additive manufacturing process, such as an additive 3D printing process, is used in forming the base plate 108. Such an additive manufacturing process may provide a base plate 108 of Al—SiC that is about 40% SiC by weight. Al—SiC with the higher percentage of SiC is more difficult to machine. However, since an additive process is used to form the base plate 108, the complex shape of the base plate 108 may be formed without requiring machining. Such a process reduces waste material, since machining that grinds away material is reduced or not needed.

Figure 3:
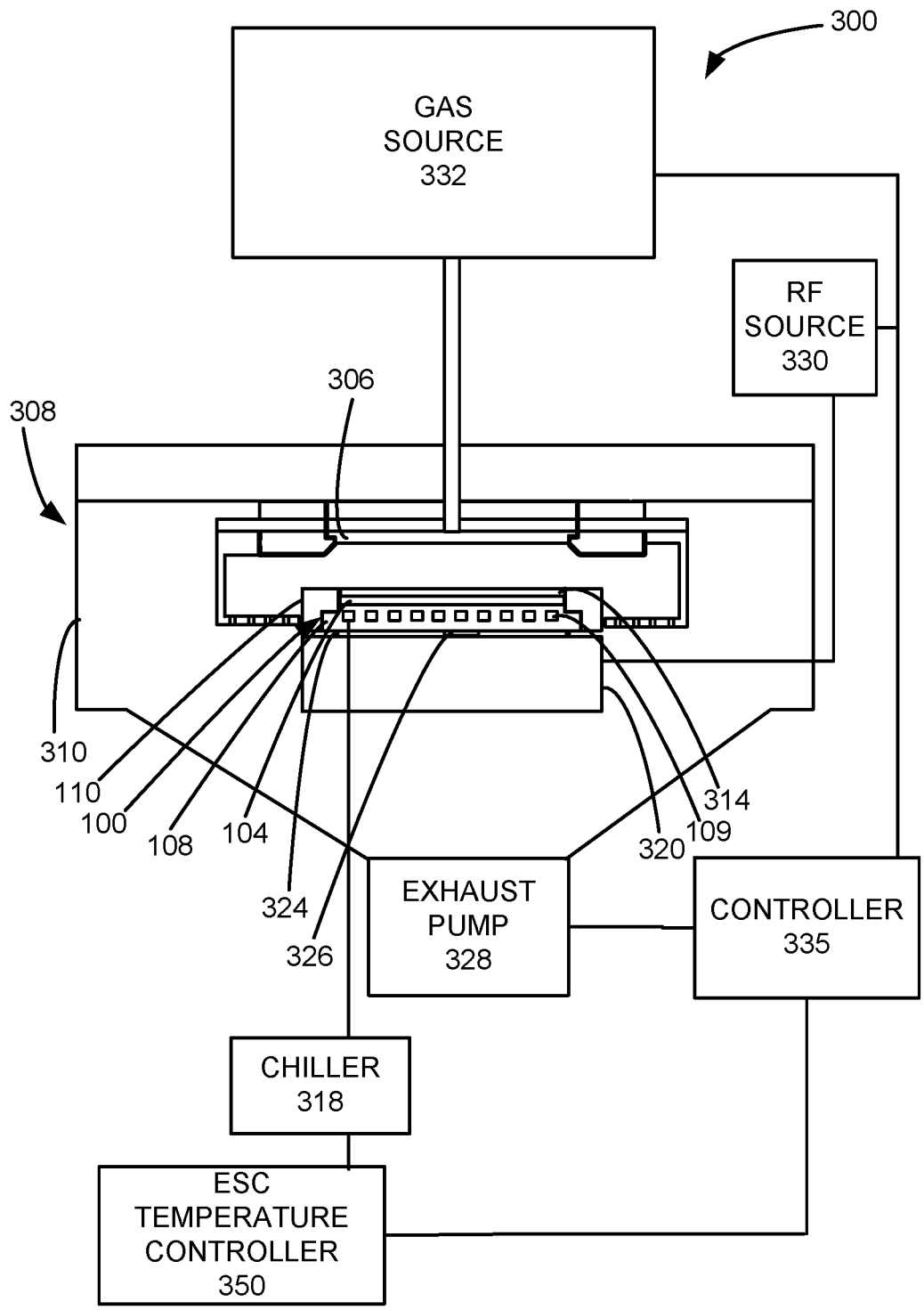
FIG. 3 is a schematic illustration of an etch reactor that may be used in an embodiment.

In an exemplary embodiment, FIG. 3 is a schematic view of an etch reactor that may be used in an embodiment. In one or more embodiments, a plasma processing chamber 300 comprises a gas distribution plate 306 providing a gas inlet and the ESC 100, within an etch chamber 308, enclosed by a chamber wall 310. Within the etch chamber 308, a stack 314 is positioned over the ESC 100. The ESC 100 comprises the ceramic plate 104 bonded to the base plate 108. An edge ring 110 surrounds the ESC 100. An ESC temperature controller 350 is connected to a chiller 318. In this embodiment, the chiller 318 provides a coolant to channels 109 in the base plate 108 of the ESC 100. A radio frequency (RF) source 330 provides RF power to a lower electrode. In this embodiment, the lower electrode is a facility plate 320 below the base plate 108 and separated from the base plate 108 by an O-ring 324. An electrically conductive rod 326 provides an electrical connection between the facility plate 320 and the base plate 108. As a result, the base plate 108 is electrically connected to the RF source 330. In an exemplary embodiment, 400 kHz and 60 MHz power sources make up the RF source 330. In this embodiment, an upper electrode, the gas distribution plate 306, is grounded. In this embodiment, one generator is provided for each frequency. Other arrangements of RF sources and electrodes may be used in other embodiments. The gas distribution plate 306 is in fluid connection with a gas source 332. An exhaust pump 328 is provided remove exhaust from the etch chamber 308. A controller 335 is controllably connected to the RF source 330, the exhaust pump 328, and the gas source 332. An example of such an etch chamber is the Flex® etch system manufactured by Lam Research Corporation of Fremont, CA. The process chamber can be a CCP (capacitively coupled plasma) reactor or an ICP (inductively coupled plasma) reactor.

Various embodiments are used in plasma processing chambers 300 that may operate at a temperature range where the ESC 100 is cooled to temperatures of less than −60° C. and heated to temperatures above 200° C. In various embodiments, the ESC temperature controller is able to cool the base plate 108 to a temperature below −40° C. and heat the base plate 108 to a temperature above 100° C.

While the disclosure has been described in terms of several preferred embodiments, there are alterations, permutations, and various substitute equivalents, which fall within the scope of this disclosure. There are many alternative ways of implementing the methods and apparatuses disclosed herein. It is therefore intended that the following appended claims be interpreted as including all such alterations, permutations, and various substitute equivalents as fall within the true spirit and scope of the present disclosure.

What is claimed is:

1. An electrostatic chuck system for a plasma processing chamber, comprising:
   a base plate comprising Al-SiC, wherein the base plate is formed by an additive manufacturing process;
   a ceramic plate disposed over the base plate; and
   a bonding layer bonding the ceramic plate to the base plate.

2. The electrostatic chuck system of claim 1, further comprising channels within the base plate.

3. The electrostatic chuck system of claim 2, wherein the channels are temperature control channels.

4. The electrostatic chuck system of claim 1, wherein a difference between a CTE of the base plate and a CTE of the edge ring is between 12.5-14.5 ppm/° C.

5. The electrostatic chuck system of claim 1, wherein the edge ring comprises at least one of quartz, ceramic, plasma corrosion resistant glass, or silicon.

6. The electrostatic chuck system of claim 1, wherein the ceramic plate comprises at least one of aluminum oxide or aluminum nitride.

7. The electrostatic chuck system of claim 1, wherein the bonding layer comprises silicone.

8. The electrostatic chuck system of claim 7, wherein the bonding layer further comprises thermally conductive filler material.

9. The electrostatic chuck system of claim 1, wherein the base plate comprises Al-SiC with 18% to 65% SiC by weight.

10. The electrostatic chuck system of claim 1, wherein the base plate comprises Al-SiC with 18% to 40% SiC by weight.

11. The electrostatic chuck system of claim 1, wherein the base plate comprises Al-SiC with 18% to 30% SiC by weight.

12. The electrostatic chuck system of claim 1, further comprising a temperature controller connected to the base plate, wherein the temperature controller is configured to heat the base plate to a temperature above 90° C. and cool the base plate to a temperature below −40° C.

13. The electrostatic chuck system of claim 1, wherein the base plate comprises:
 a top plate, wherein channels are machined into a bottom of the top plate; and
 a bottom plate connected to the top plate.

* * * * *